(12) United States Patent
Hasegawa (10) Patent No.: US 7,767,914 B2
(45) Date of Patent: Aug. 3, 2010

(54) MULTILAYER PRINTED WIRING BOARD, METHOD FOR MANUFACTURING BUILDUP PRINTED WIRING BOARD, AND ELECTRONIC APPARATUS

(75) Inventor: Kenji Hasegawa, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/198,794

(22) Filed: Aug. 26, 2008

(65) Prior Publication Data

US 2009/0133919 A1    May 28, 2009

(30) Foreign Application Priority Data

Nov. 27, 2007    (JP) .............................. 2007-306012

(51) Int. Cl.
H05K 1/11    (2006.01)
(52) U.S. Cl. ................. 174/264; 174/265; 174/262; 361/793; 361/795; 361/748; 361/792; 29/846
(58) Field of Classification Search ................. 174/264, 174/261, 262, 265, 250, 255, 257, 254, 258; 361/793, 795, 790, 748–751, 777, 778, 792, 361/785, 679.01, 739, 771, 760; 29/846, 29/829
See application file for complete search history.

(56) References Cited

U.S. PATENT DOCUMENTS

| | | | |
|---|---|---|---|
| 6,590,165 B1 | 7/2003 | Takada et al. | |
| 6,828,510 B1 * | 12/2004 | Asai et al. | 174/255 |
| 7,378,602 B2 * | 5/2008 | Ikeda | 174/262 |
| 2002/0139578 A1 * | 10/2002 | Alcoe et al. | 174/262 |
| 2003/0150644 A1 | 8/2003 | Takada et al. | |
| 2006/0137904 A1 | 6/2006 | Hirata | |
| 2007/0000687 A1 * | 1/2007 | Brist et al. | 174/255 |

FOREIGN PATENT DOCUMENTS

| | | |
|---|---|---|
| CN | 1622740 | 6/2005 |
| JP | 05-67879 | 3/1993 |
| JP | 2002-198653 | 7/2002 |
| JP | 2004-311736 | 11/2004 |
| JP | 2005-166764 | 6/2005 |
| JP | 2006-186029 | 7/2006 |

OTHER PUBLICATIONS

Japanese Patent Application No. 2007-306012 Notice of Reasons for Rejection mailed Jan. 13, 2009 (English Translation).
Chinese Patent Application No. 200810149078.4, The First Office Action, mailed Apr. 2, 2010 (English translation).

* cited by examiner

*Primary Examiner*—Dameon E Levi
*Assistant Examiner*—Hoa C Nguyen
(74) *Attorney, Agent, or Firm*—Blakely, Sokoloff, Taylor & Zafman LLP (57) ABSTRACT

A multilayer printed wiring board includes: an insulating base including an indentation section formed thereon; a conductor pattern formed on the insulating base, the conductor pattern including a thick film section formed by embedding a conductor in the indentation section; and a via hole section formed in an upper layer of the insulating base, the via hole section including a bottom portion that is in contact with the thick film section.

11 Claims, 6 Drawing Sheets

MULTILAYER PRINTED WIRING BOARD, METHOD FOR MANUFACTURING BUILDUP PRINTED WIRING BOARD, AND ELECTRONIC APPARATUS

CROSS-REFERENCE TO RELATED APPLICATIONS

This application is based upon and claims the benefit of priority from Japanese Patent Application No. 2007-306012, filed Nov. 27, 2007, the entire contents of which are incorporated herein by reference.

BACKGROUND

1. Field

An aspect of the invention relates to a multilayer printed wiring board that is applicable to a compact electronic apparatus, etc.

2. Description of Related Art

In association with a reduction in the weight and thickness of portable electronic equipment, greater packaging density and weight reduction are required even in connection with a printed wiring board used in the equipment. In a multilayer printed wiring board manufactured under a buildup method, the thickness of a copper plating layer forming a conductor layer of a buildup section (the thickness of a conductor foil film) is made smaller than the thickness of a copper plating layer of a core layer, to thus enable pursuit of lighter weight and a further slimming down.

However, when the thickness of the copper plating forming the conductor layer is reduced, an extremity of an open section penetrates into a conductor layer, to thus reach a lower layer, during boring operation using a laser beam for forming interstitial via holes, such as blind via hole or buried via holes. This raises a quality problem of formation of irregularly-shaped via holes whose bottoms are not filled with a conductor.

As a technique for forming via holes in a multilayer printed wiring board of this type, there have hitherto been present a technique (JP-A-2006-186029) for previously forming a barrier layer having the same thickness as that of a via hole pad and a metal-plated pad in bottoms of some via holes in such a way that all of the via holes become flat along a surface layer and a technique (JP-A-2002-198653) for enhancing connection reliability by forming open holes in the centers of positions of vias in an internal layer conductor circuit. However, these related-art techniques might not meet a requirement for a reduction in the thickness of a conductor layer in a buildup section while maintaining uniform quality of via holes.

As mentioned above, there has hitherto been a limitation in satisfying a requirement for a reduction in the thickness of a conductor layer in a buildup section while maintaining the quality of via holes constantly.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION

Various embodiments according to the invention will be described hereinafter with reference to the accompanying drawings. In general, according to one embodiment of the invention, a multilayer printed wiring board includes: an insulating base including an indentation section formed thereon; a conductor pattern formed on the insulating base, the conductor pattern including a thick film section formed by embedding a conductor in the indentation section; and a via hole section formed in an upper layer of the insulating base, the via hole section including a bottom portion that is in contact with the thick film section.

Figure 1:
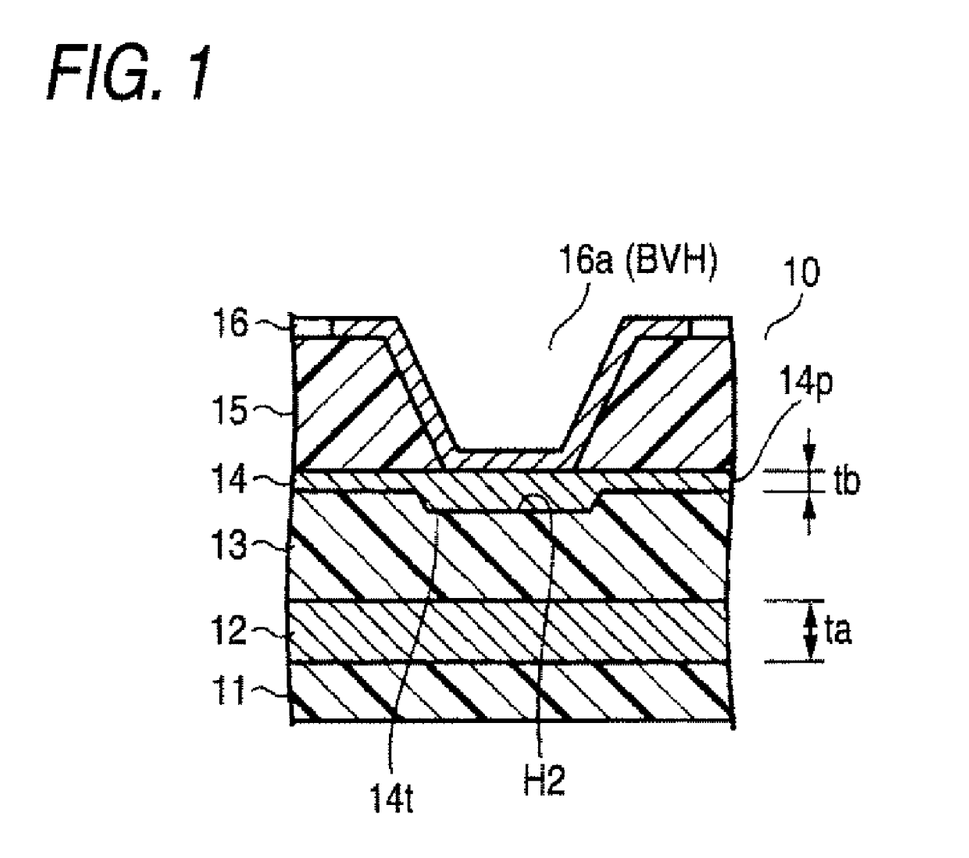
FIG. 1 is a view showing the configuration of the main section of a buildup printed wiring board of a first embodiment.

The configuration of the main section of a multilayer printed wiring board of a first embodiment according to the invention is shown in FIG. 1. As shown in FIG. 1, a buildup multilayer printed wiring board 10 of the first embodiment includes an insulating substrate 13; indentation sections H2 that do not reach a lower layer formed in the insulating substrate 13; a conductor layer 14 that is provided on the insulating substrate 13 and that has a conductor pattern 14$p$ in which a thick film section 14$t$ is formed by burying the indentation section H2 with a conductor; and via holes 16$a$ that are provided in an upper layer of the insulating substrate 13 while bottoms of the via holes remain in contact with the thick film section 14$t$.

The insulating substrate 13 is stacked on a core section 11 via a conductor layer 12 provided on an upper layer of the core section 11, thereby constituting an inner insulating layer of a buildup section. An insulating substrate 15 is stacked on the insulating substrate 13 via the conductor layer 14, thereby constituting an outer insulating layer of the buildup section. The outer insulating layer is provided with a conductor layer 16. The inner insulating layer is assigned the same reference numeral as that of the insulating substrate 13, and the outer insulating layer is assigned the same reference numeral as that of the insulating substrate 15. The insulating substrate 13 is referred to as a first insulating layer; the insulating substrate 15 is referred to as a second insulating layer; the conductor layer 14 is referred to as a first conductor layer; and the conductor layer 16 is referred to as a second conductor layer.

The via holes 16a are interstitial via holes (IVH) for conductively connecting the first conductor layer 14 to the second conductor layer 16. When provided on an outer layer side of the buildup section, the via holes act as blind via holes (BVH). When provided on an inner layer side of the buildup section, the via holes act as buried via holes.

The plating thickness tb (the film thickness) of the first conductor layer 14 except thick film sections 14t is formed so as to become smaller than the plating thickness ta of the conductor layer 12 provided on the core section 11. Specifically, the first conductor layer 14 is formed to a plating thickness which is smaller than that of the conductor layer 12, except a pattern area located at the bottoms of the via holes. In the present embodiment, the plating thickness (film thickness) tb of the first conductor layer 14 is set to one-half or less of the plating thickness ta of the conductor layer 12 provided on the core section 11.

When the first conductor layer 14 is formed into a uniformly-thin film including a pattern area located at the bottoms of the via holes, there is a potential of extremities of openings penetrating into the first conductor layer 14 formed in the form of a thin film, by means of boring operation performed through use of a laser beam during formation of via holes, to thus form irregularly-shaped via holes whose bottoms are not filled with a conductor. In contrast, according to the embodiment, the thick film section 14t acts as a barrier against boring operation for forming via holes, thereby preventing the extremities of the openings from penetrating into the thin film. Hence, normally-shaped via holes whose bottoms are uniformly filled with a conductor can be formed, and the plating thickness (film thickness) of the first conductor layer 14 except the thick film section 14t can be reduced. Thereby, a reduction in the thickness of the conductor layer in the buildup section can be expected without affecting the quality of via holes formed in the buildup section.

FIGS. 2 through 5 show steps of forming the thick film section 14t and the via hole 16a whose bottom is in contact with the thick film section 14t. In addition to the thick film section 14t and the via hole 16a, the drawings show, as an example, a buildup structure forming a filled via hole FV, as well.

Figure 2:
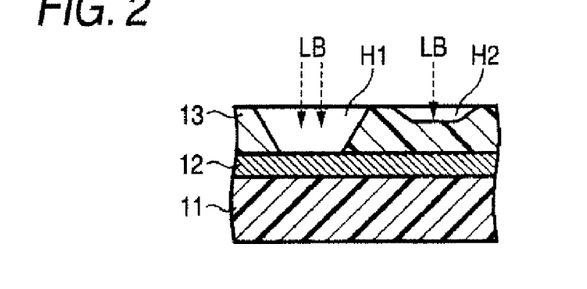
FIG. 2 is a view showing steps of manufacturing the buildup printed wiring board of the first embodiment.

In Step 1 shown in FIG. 2, the first insulating layer 13 that is to serve as an inner insulating layer of the buildup section is stacked on the core section 11 by way of the conductor layer 12 provided on the upper surface of the core section 11. The first insulating layer 13 is subjected to boring by means of a laser beam LB, thereby opening; for example, holes H1 that are intended for forming filled via holes FV whose bottoms are in contact with the conductor layer 12 of the core section 11 and that penetrate through the first insulating layer 13.

Even in this laser processing step, areas on the first insulating layer 13 where bottoms of interstitial via holes are to be located are also subjected to boring by means of the laser beam LB whose energy is lower than that of laser irradiation used for boring the holes H1, thereby forming shallow holes; namely, indentation sections H2 that do not reach a lower layer.

Figure 3:
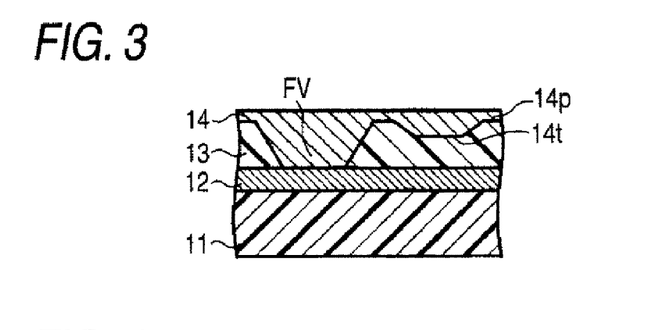
FIG. 3 is a view showing steps of manufacturing the buildup printed wiring board of the first embodiment.

In Step 2 shown in FIG. 3, the holes H1 and H2 formed in the first insulating layer 13 are filled with conductor plating; for example, copper plating, to thus form a first conductor layer 14 whose upper surface is flat. By means of a copper plating step, filled via holes FV reaching the conductor layer 12 of the core section 11 are created in the holes H1, whereupon a conductor pattern 14p having thick film sections 14t in the holes H2 is formed. As shown in FIG. 1, the first conductor layer 14 is formed in such a way that the thickness of copper plating of an area except the filled via holes FV and the thick film sections 14t (a wiring pattern area including the conductor pattern 14p) is made small than the plating thickness of the conductor layer 12 provided in the core section 11.

Figure 4:
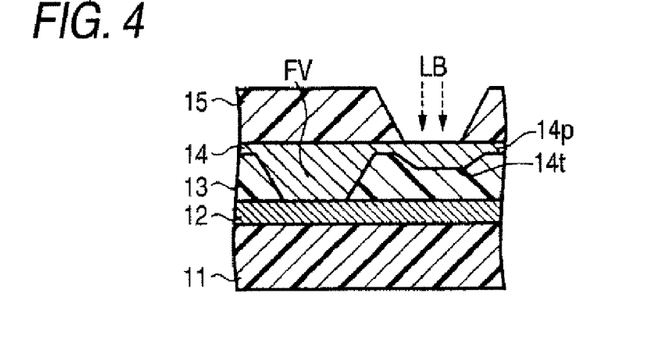
FIG. 4 is a view showing steps of manufacturing the buildup printed wiring board of the first embodiment.

In Step 3 shown in FIG. 4, the second insulating layer 15 forming an upper layer of the first insulating layer 13 is stacked on the first insulating layer 13 by way of the first conductor layer 14. The second insulating layer 15 is irradiated with the laser beam LB while the thick film sections 14t are taken as targets, thereby performing boring operation for forming via holes in the second insulating layer 15 located on the thick film sections 14t.

In the laser processing step, the thick film sections 14t act as a barrier against boring operation performed by use of the laser beam LB, thereby preventing penetration of the extremities of the openings. Thus, even when the first conductor layer 14 is formed thinly, holes for via holes whose bottom are filled with the first conductor layer 14 can be formed.

Figure 5:
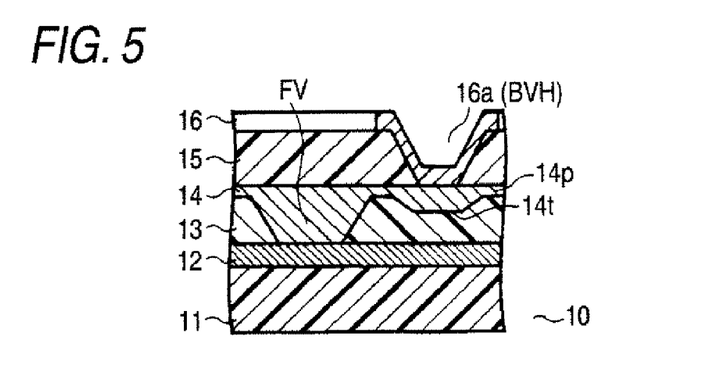
FIG. 5 is a view showing steps of manufacturing the buildup printed wiring board of the first embodiment.

In Step 4 shown in FIG. 5, holes bored in step 3 are plated with copper, whereby the second conductor layer 16 having interstitial via holes 16a whose bottoms are in contact with the thick film sections 14t is formed.

According to steps of manufacturing such a buildup printing wiring board, normally-shaped via holes whose bottoms are evenly filled with a conductor can be formed, and the plating thickness (film thickness) of the pattern of the conductor layer 14 except the thick film sections 14t can be reduced. As a result, a reduction in the thickness of the conductor layer in the buildup section can be expected without affecting the quality of via holes formed in the buildup section.

Figure 6:
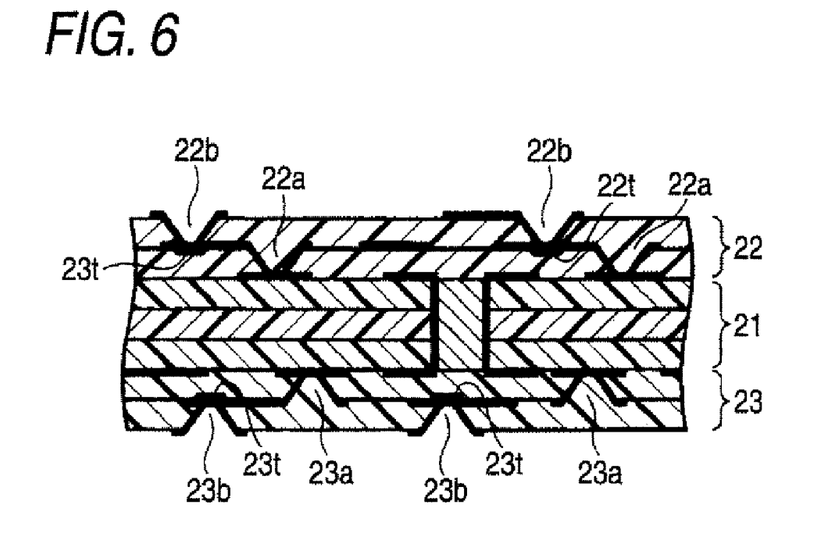
FIG. 6 is a view showing the configuration of a buildup printed wiring board of a second embodiment.

FIG. 6 shows a second embodiment of a buildup printed wiring board to which the via holes of the first embodiment are applied.

In the second embodiment shown in FIG. 6, buildup sections 22 and 23, each of which is made up of two layers, are stacked on both outer layers (on either outer layer) of a core section 21 made of a multilayer plate consisting of four layers.

Of via holes 22a, 22b, 23a, and 23b formed in these buildup sections 22 and 23, via holes establishing interlayer connection between the buildup sections 22 and 23; namely, blind via holes (BVH) 22b and 23b, are formed, as described in connection with the first embodiment, respectively on conductor patterns in which thick film sections 22t and 23t are formed at bottoms of the patterns.

By means of the structure, conductor layers provided among layers in buildup sections 22 and 23 can be made thinly except areas where thick film sections 22t and 23t are to be formed. Thus, a reduction in the thickness of the conductor layers in the buildup section can be expected without affecting the quality of via holes formed in the buildup sections.

Figure 7:
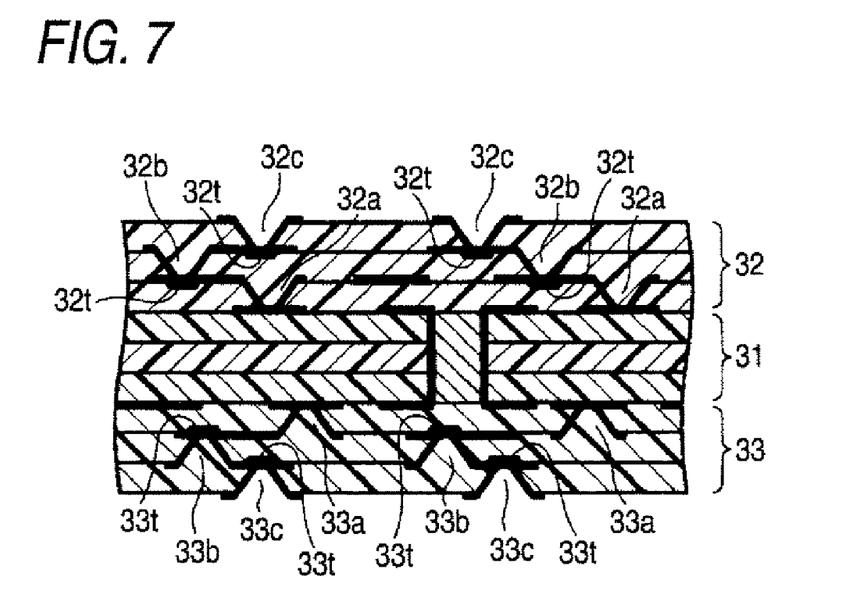
FIG. 7 is a view showing the configuration of a buildup printed wiring board of a third embodiment.

FIG. 7 shows a third embodiment of a buildup printed wiring board to which the via holes of the first embodiment are applied.

In the third embodiment shown in FIG. 7, buildup sections 32 and 33, each of which is made up of three layers, are stacked on both outer layers of a core section 31 made of a multilayer plate consisting of four layers.

Of via holes 32a, 32b, 32c, 33a, 33b, and 33c formed in these buildup sections 32 and 33, via holes establishing interlayer connection within the buildup sections 32 and 33; namely, buried via holes 32b and 33b establishing connection among inner layers, and blind via holes (BVH) 32c and 33c provided in the outer layers, are formed respectively on conductor patterns in which thick film sections 32*t* and 33*t* are formed at bottoms of the patterns as described in connection with the first embodiment.

By means of the structure, conductor layers provided among layers in buildup sections 32 and 33 can be made thinly except areas where thick film sections 32*t* and 33*t* are to be formed. Thus, a reduction in the thickness of the conductor layers in the buildup section can be expected without affecting the quality of via holes formed in the buildup sections.

Figure 8:
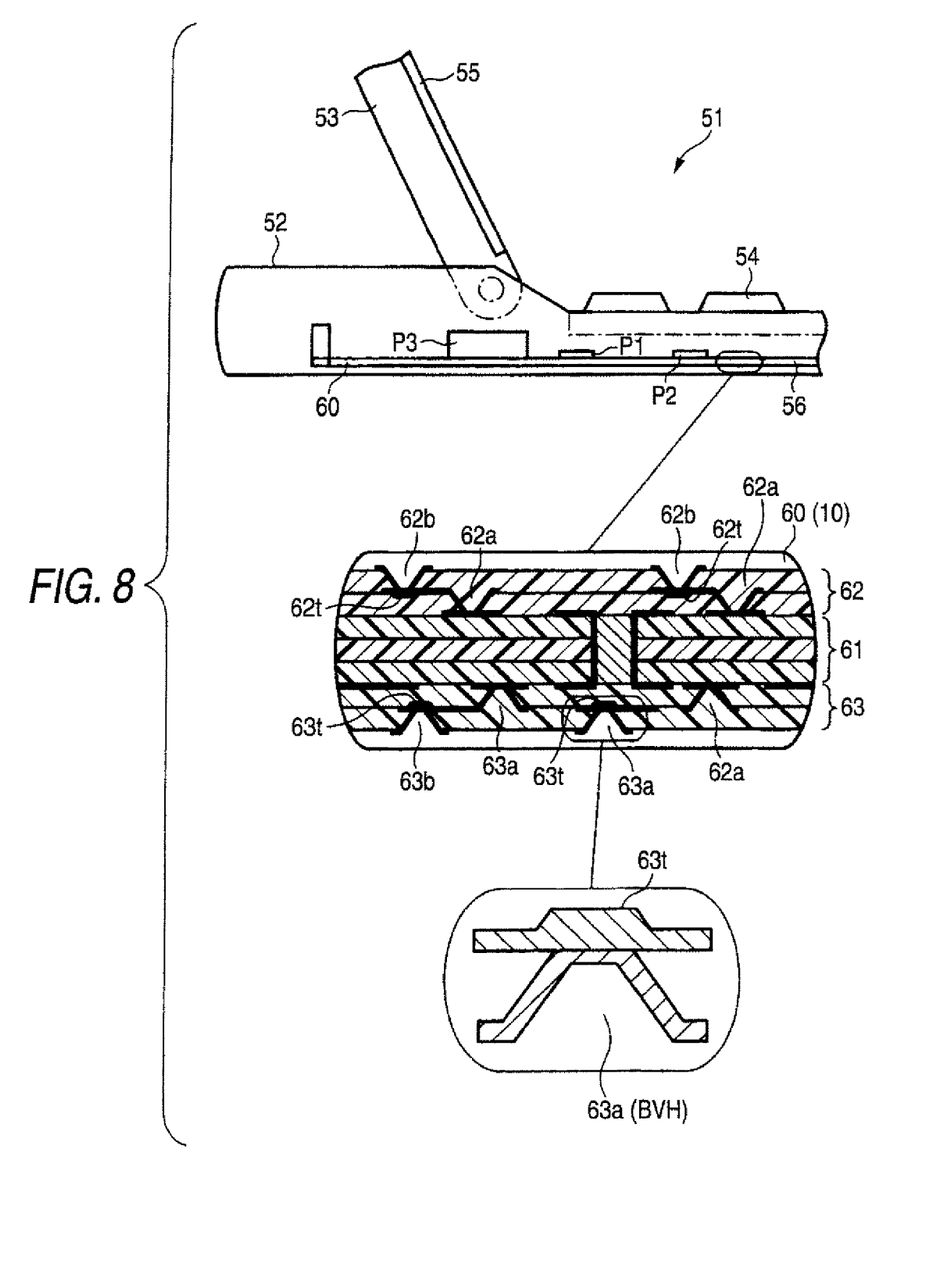
FIG. 8 is a view showing the configuration of electronic equipment using a buildup printed wiring board of a fourth embodiment.

FIG. 8 shows the configuration of portable electronic equipment of a fourth embodiment of the present invention. The portable electronic equipment of the fourth embodiment constitutes a circuit board by use of a buildup printed wiring board to which the via holes of the first embodiment are applied.

In FIG. 8, a display section housing 53 is pivotally attached to a main unit 52 of portable electronic equipment 51 by way of a hinge mechanism. The main unit 52 is provided with an operation section, such as a pointing device, a keyboard 54, and the like. The display section housing 53 is provided with a display device 55, such as an LCD.

Further, the main unit 52 is provided with a keyboard 54 and a circuit board (mother board) 56 on which there are mounted control circuit elements (P1, P2, . . . ) for controlling inputs and outputs of the display device 55 and the like. The configuration of the principal section of the circuit board 56 is shown in FIG. 1, and a stacked structure is formed by use of a buildup printed wiring board 60 shown in FIG. 6. In the buildup printed wiring board 60, buildup sections 62 and 63, each of which is made up of two layers, are stacked respectively on both outer layers of a core section 61 made up of a multilayer plate consisting of four layers.

Of via holes 62*a*, 62*b*, 63*a*, and 63*b* formed in the buildup sections 62 and 63, via holes for establishing interlayer connection among the buildup sections 62 and 63; namely, blind via holes (BVH) 62*b* and 63*b* are formed respectively, as partially enlarged, on conductor patterns where thick film sections 62*t* and 63*t* are formed at bottoms.

As a result of the circuit board 56 being formed by use of the buildup printed wiring board 60 of such a configuration, the circuit board can contribute to a reduction in the thickness of the portable electronic equipment 51.

FIGS. 9 through 11 and FIGS. 12 through 14 show applied examples in which the thick film sections described in connection with the first embodiment of the present invention are applied to an area other than the areas where via holes are to be created.

Figure 11:
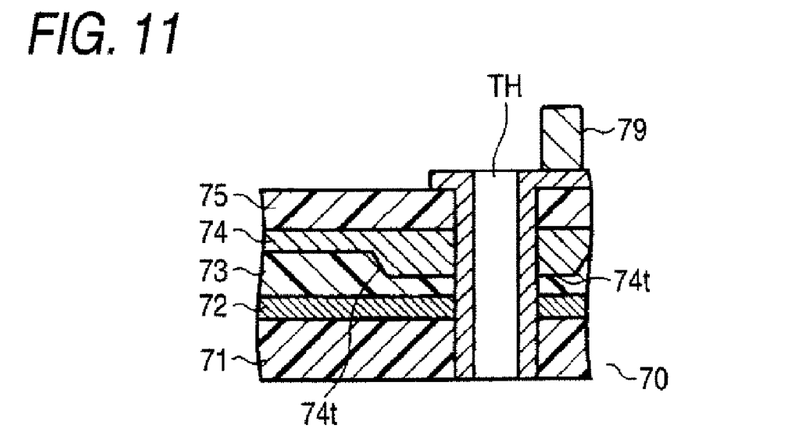
FIG. 11 is a view showing an example application of formation of thick film sections according to one embodiment.

FIG. 11 shows an example in which the means for forming the thick film sections of the first embodiment is applied to a heat dissipation channel of an electronic component (hereinafter called a "heat generating component") 79 that dissipates heat during operation of a circuit. In this example, in a mount area where the heat generating component 79 of the circuit board 70 is to be mounted, thick film sections 74*t* are formed in an inner conductor layer 74, and through holes TH are formed so as to penetrate through the thick film sections 74*t*, thereby creating heat dissipation channels. By means of such a configuration, highly-efficient heat conduction channels can be formed for the heat generating component 79.

Figure 9:
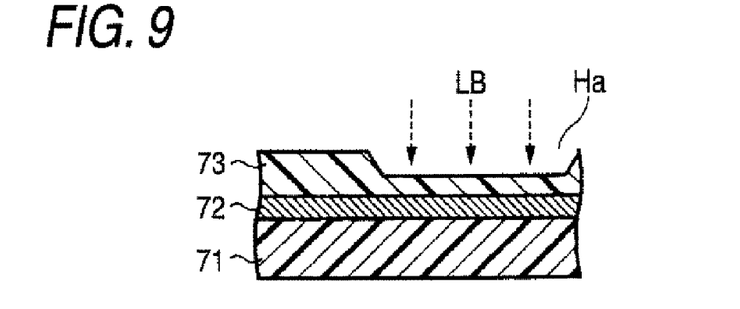
FIG. 9 is a view showing an example application of formation of thick film sections according to one embodiment.

As shown in FIG. 9, in a buildup substrate constituting such a circuit board 70, an insulating layer 73 for a buildup section is stacked on the insulating layer 71 constituting a core section, by way of a conductor layer 72 of the core section. Indentation sections Ha that do not reach the conductor layer 72 are formed in the insulating layer 73 by means of boring operation using a laser vias LB.

Figure 10:
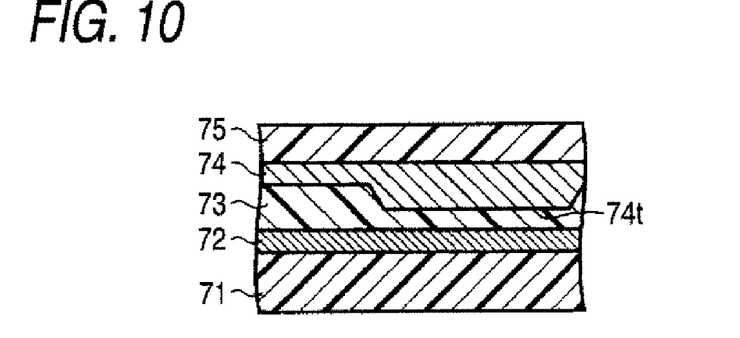
FIG. 10 is a view showing an example application of formation of thick film sections according to one embodiment.

As shown in FIG. 10, the insulating layer 73 where the indentation sections H are formed is subjected to copper plating, to thus fill in the indentation sections H by means of copper plating. Thereby, a conductor layer 74 having the thick film sections 74*t* is formed on the insulating layer 73 of the buildup section.

As shown in FIG. 11, the through holes TH are caused to penetrate through the thick film sections 74*t*, thereby forming heat conduction channels that enable efficient transmission of heat developing in the heat generating component 79.

Figure 12:
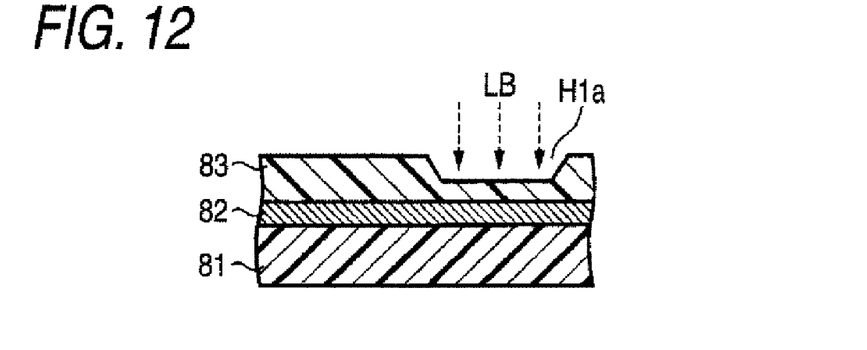
FIG. 12 is a view showing an example application of formation of thick film sections according to one embodiment.

FIG. 12 shows an example in which the means for forming the thick film sections of the first embodiment is applied to a circuit pattern requiring impedance control; for example, a transmission channel for a differential signal. In this example, in a buildup substrate 80, a circuit pattern 84 and a circuit pattern 85 that is different in thickness from the circuit pattern 84 and whose impedance is controlled are formed in inner layers of a buildup section. A circuit pattern 87 and a circuit pattern 88 that is different in thickness from the circuit pattern 87 and whose impedance is controlled are formed in outer layers of the buildup section.

As shown in FIG. 12, in the buildup substrate 80, an insulating layer 83 for the buildup section is stacked on an insulating layer 81 forming a core section, by way of a conductor layer 82 of the core section. Indentation sections H1*a* that do not reach the conductor layer 82 are formed in the insulating layer 83 by means of boring operation using laser vias LB.

Figure 13:
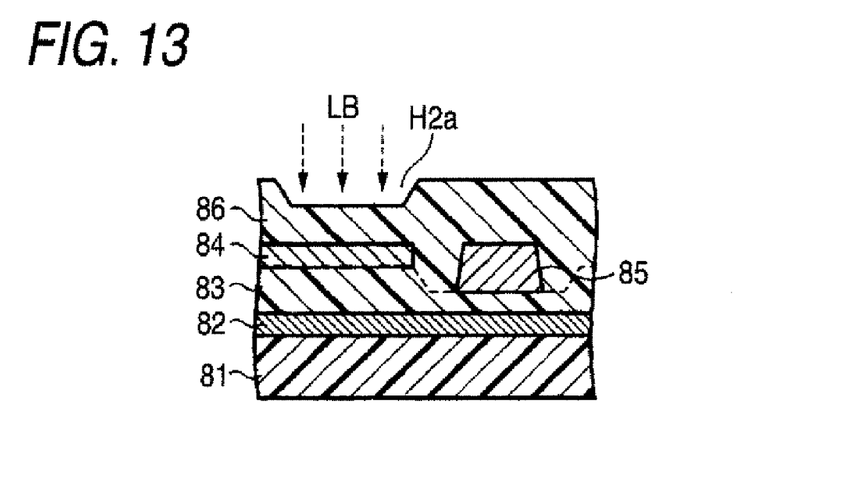
FIG. 13 is a view showing an example application of formation of thick film sections according to one embodiment.

The insulating layer 83 in which the indentation sections H1 are formed is subjected to copper plating while the indentation sections H1*a* are included. As shown in FIG. 13, the circuit pattern 85 that differs in thickness from the circuit pattern 84 and whose impedance is controlled is formed in the thus-formed indentation sections H1.

Figure 14:
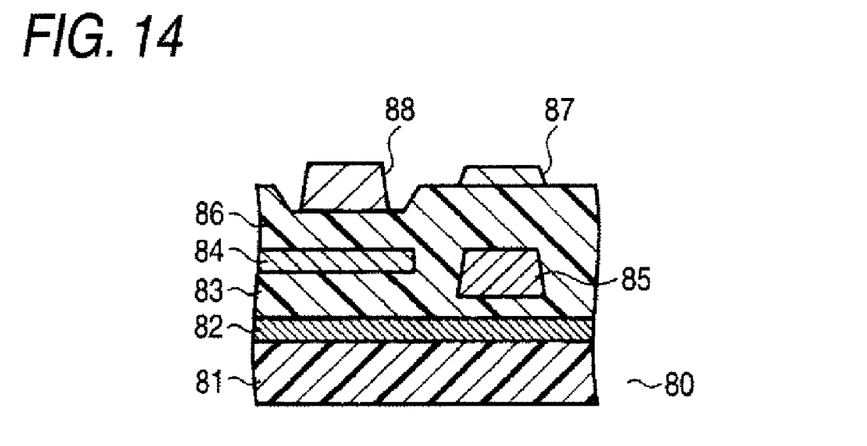
FIG. 14 is a view showing an example application of formation of thick film sections according to one embodiment.

Further, as shown in FIG. 13, the insulating layer 86 is stacked on the insulating layer 83, and indentation sections H2*a* that do not reach the conductor layers 84 and 85 are formed in the insulating layer 86 by means of boring operation using laser vias LB. The insulating layer 86 in which the indentation sections H2*a* are formed is subjected to copper plating. Thus, as shown in FIG. 14, the circuit pattern 88 that differ in thickness from the circuit pattern 87 and whose impedance is controlled is formed.

By having such a configuration, a specific circuit pattern can be subjected to impedance control while a reduction in the thickness of the conductor layer in the buildup section is attempted.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multilayer printed wiring board comprising:
   a first insulating substrate formed to on a core section provided with a first conductive layer;
   an indentation section formed in the first insulating substrate;
   a second conductor layer provided on the first insulating substrate, the second conductor layer having a conductor pattern including a first section formed by a conductor and a thick film section is formed by embedding a conductor in the indentation section, the conductor along the first section of the second conductive layer is lesser in thickness than the conductor within the thick film section;

a second insulating substrate accumulated on the first insulating substrate so that the second conductor layer having the conductor pattern is interposed between the first insulating substrate and the second insulating substrate; and a via hole provided on the second insulating substrate, the via hole having a bottom portion, the bottom portion being in contact with the thick film section of the conductor pattern;

wherein a thickness of the first section of the second conductor layer is less than a thickness of the first conductive layer on the core section, except for the thick film section.

2. The multilayer printed wiring board according to claim 1, wherein the thick film section serves as a barrier against drilling operation for forming the via hole in the insulating substrate.

3. The multilayer printed wiring board according to claim 2, wherein the via hole is a blind via hole.

4. The multilayer printed wiring board according to claim 2, wherein the via hole is a buried via hole.

5. The multilayer printed wiring board according to claim 2, wherein the thick film section of the second conductor layer is at least equal in thickness to the first conductor layer.

6. The multilayer printed wiring board according to claim 2, wherein the second conductor layer is formed so that the first section of the second conductor layer is reduced in thickness while the thick film section of the second conductor layer remains greater in thickness that the first section to avoid boring through the second conductor layer during lasing of the via hole.

7. A method for manufacturing a buildup printed wiring board comprising:

forming an indentation section by lasing a portion of a first insulating layer to configure a buildup section;

forming, in the first insulating layer, a first conductor layer having a conductor pattern which forms a first section of a conductor having a first thickness and a thick film section in the indentation section forming a conductor having a second thickness greater than the first thickness;

accumulating a second insulating layer on the first insulating layer so as to sandwich the first conductor layer therebetween;

forming a via hole within the second insulating layer situated over the thick film section so that a bottom of the via hole is in contact with the thick film section of the conductor pattern; and forming, in the second insulating layer, a second conductor layer having the via hole;

wherein a thickness of the conductor in the first section of the first conductor layer is made less than a thickness of a conductive layer of a core section serving as a substrate of the buildup section, except for the thick film section of the conductor pattern.

8. The method for manufacturing a buildup printed wiring board according to claim 7, further comprising:

accumulating a third insulating layer on the second insulating layer so as to sandwich the second conductor layer therebetween;

forming an indentation section, which does not reach a lower layer, in the third insulating layer; and forming, in the third insulating layer, a third conductor layer having a conductor pattern forming a thick film section in the indentation section;

wherein a buried via hole is formed in the second insulating layer, and a blind via hole is formed in the third insulating layer.

9. The method of claim 8, wherein the forming of the indentation section includes lasing a portion of the first insulating layer.

10. The method of claim 8, wherein forming of the first conductor layer includes plating a top surface of the first insulating layer and filling the thick film section with the conductor.

11. An electronic apparatus comprising:

an electronic apparatus main body; and a circuit plate provided in the electronic apparatus main body;

wherein the circuit plate is configured by a buildup printed wiring board, the buildup printed wiring board comprising:

a first insulating substrate formed to be built-up on a core section provided with a first conductive layer;

an indentation section formed in the first insulating substrate on an opposite side of the first conductive layer;

a second conductor layer provided on the first insulating substrate, the second conductor layer having a conductor pattern in which a thick film section is formed by embedding a conductor in the indentation section of the first insulating substrate and the thick film section having a thickness greater than other sections of the conductor pattern;

a second insulating substrate accumulated on the first insulating substrate so as to sandwich the second conductor layer having the conductor pattern therebetween; and a via hole provided on the second insulating substrate, the via hole having a bottom portion, the bottom portion being in contact with the thick film section of the conductor pattern;

wherein a thickness of the conductor layer having the conductor pattern is less than a thickness of the conductive layer on the core section, except for the thick film section.

* * * * *